United States Patent [19]

Mancuso

[11] Patent Number: 5,401,964
[45] Date of Patent: Mar. 28, 1995

[54] REDUCED ELECTRON SCATTERING PHOSPHOR SCREEN FOR HIGH RESOLUTION TRANSMISSION ELECTRON MICROSCOPE IMAGING

[76] Inventor: James F. Mancuso, 50 Prospect St., Rowley, Mass. 01969

[21] Appl. No.: 165,091

[22] Filed: Dec. 9, 1993

[51] Int. Cl.⁶ .............................................. H01J 37/295
[52] U.S. Cl. ...................................... 250/307; 250/311
[58] Field of Search ................................. 250/307, 311

[56] References Cited

U.S. PATENT DOCUMENTS

| | | | |
|---|---|---|---|
| 3,560,792 | 2/1971 | Goetze et al. | 315/11 |
| 4,680,469 | 7/1987 | Nomura et al. | 250/311 |
| 4,739,399 | 4/1988 | Swann et al. | 250/311 |
| 4,851,670 | 7/1989 | Krivanek | 250/311 |
| 5,065,029 | 11/1991 | Krivanek | 250/441.1 |
| 5,277,932 | 1/1994 | Spencer | 427/248.1 |

OTHER PUBLICATIONS

Herrmann, K.-H., "Electron Image Conversion", Proceedings of the 64th Annual Meeting of the Electron Microscopy Society of America, 1986, pp. 78–81.
Kraus, B. et al., "Performance of Newvicon and CCD Real-Time EM Observation Systems", Proc. XITH Int. Cong. On Electron Microscopy, Kyoto, 1986, pp. 455–456.
Matsuura S. et al., Proc. XITH Int. Cong. On Electron Microscopy, Kyoto, 1986.

Primary Examiner—Bruce C. Anderson
Attorney, Agent, or Firm—Fish & Richardson

[57] ABSTRACT

A method of imaging a specimen by transmission of electrons with energies below 1 MeV including the steps of passing a beam of electrons having energies that are less than 1 MeV through the specimen to produce a first transmitted electron beam; passing the first transmitted electron beam through an imaging screen to generate a light image and a second transmitted electron beam; preventing more than about 95% of the second transmitted electron beam from reflecting back to the imaging screen; and focusing the generated light image onto an electronic camera. The imaging screen includes a support structure and a light generating layer, in which the support structure has a thickness that is less than one half the Kanaya-Okayama range of electrons in the imaging screen.

18 Claims, 1 Drawing Sheet

REDUCED ELECTRON SCATTERING PHOSPHOR SCREEN FOR HIGH RESOLUTION TRANSMISSION ELECTRON MICROSCOPE IMAGING

FIELD OF THE INVENTION

The invention relates to an optical kit including a phosphor or scintillator layer supported by a support structure for producing high resolution images from electronic cameras used in transmission electron microscopy.

BACKGROUND OF THE INVENTION

A transmission electron microscope (TEM) creates images by generating an electron beam that penetrates a very thin specimen. A projected image of electron intensity corresponds to the specimen structure. Direct exposure of photographic emulsion on either glass plates or film has historically produced TEM images with the highest resolution and information density. Electronic camera systems that view screens coated with phosphors[1] or scintillators[2] are often used in recording when photographic film is not needed or when high sensitivity and live time viewing are required. When coupled to digital image acquisition systems, electronic cameras provide an cost efficient way to store images on digital media for viewing, digital analysis, and archival.

[1] G. F. J. Garlick, "Cathodo- and Radioluminescence", in *Luminescence of Inorganic Solids*, edited by P. Goldberg, Academic Press (1966) pp. 685-731.
[2] R. Autrata, P. Schauer, Jos. Kvapil, "Single-Crystal Aluminates—A New Generation of Scintillators for Scanning Electron Microscopes and Transparent Screens in Electron Optical Devices", Scanning Electron Microscopy, Pt. 2, (1983) pp. 489-500.

The resolution available from an electronic camera system in a TEM is limited by the phosphor or scintillator screen. Since the highest available resolution is about 25 line-pairs/millimeter (i.e., lp/mm), camera systems must typically have relatively large, bulky screens. The large screens must, in turn, be optically coupled to either 1) large, expensive camera sensors at unity magnification or 2) smaller, more economical sensors at as much as 3:1 demagnification. Unity magnification systems using either fiber optics or lens optics can provide detection quantum efficiency of close to 100%, but are inherently expensive. Demagnifying systems are less efficient than unity magnification systems[6]. In addition, the modulation transfer function (MTF) at this resolution is low so that faint edges often have poor visibility.

[6] I. P. Csorba, *Image Tubes*, Howard W. Sams & Co., Inc., (1985).

In all systems operating below 1 MeV, a phosphor or scintillator with a thickness of typically 40 microns or less is deposited on a light transparent support structure, such as a glass plate or a fiber optic bundle. Electrons first excite the phosphor so that it emits visible light. Then they are absorbed by the glass beneath the phosphor. The visible light image is transmitted to an electronic camera through a transparent support material via a lens system[3] or a fiber optic bundle[4]. The best resolution for these systems (i.e., about 25 lp/mm) is achieved at around 100 keV.

[3] S. Matsuura, T. Nino, K. Oba, and S. Horiuchi, "Development of High Sensitive Imaging Device for TEM", Proc. XIth Cong. on Electron Microscopy, Kyoto (1986) pp. 441-442.
[4] B. Kraus, O. L. Krivanek, N. T. Swann, C. C. Ahn, and P. R. Swann, "Performance of Newvicon and CCD Real-Time EM Observation Systems", Proc. XIth Cong. on Electron Microscopy, Kyoto (1986) pp. 455-456.

At 1 million electron volts (1 MeV) Hermann[5] found that radiation damage precluded the use of fiber optics, and he employed plastic membranes with a thick phosphor layer and a tandem lens at unity magnification to achieve sufficient brightness. Due to his use of a thick phosphor, the resolution achieved by his screens was poor (i.e., less than 20 lp/mm).

[5] K.-H. Hermann, "Electron Image Conversion," Proc. Elect. Micr. Soc. Am. (1986) pp. 78-81.

SUMMARY OF THE INVENTION

A major cause for the loss of resolution in TEMs which employ high energy electrons (i.e., 1 MeV and above) is backscattering of the incident electrons in the substrate of the phosphor/scintillator screens used to produce a light image. Incident electrons strike a phosphor and then scatter for a relatively large distance in the substrate supporting the phosphor. Some of the scattered electrons finally re-enter the phosphor. Both the incident and re-entering electrons stimulate the emission of light. Since the desired source of light is at the point of incidence, the fraction of the light that emanates far from the point of incidence blurs the image. In cases such as Hermann's where plastic films supported the phosphor, electron backscattering from a nearby glass window or lens would have a similar effect, since electrons backscattering off these surfaces would strike the screen at sufficient energy and in sufficient quantity to degrade the image.

It has been discovered that these scattering mechanisms also play a significant role in degrading and/or limiting image resolution in TEMs which employ lower energy electrons (i.e., below 1 MeV). Apparently, this has gone unnoticed by others in the field because conventional imaging screens use relatively thick phosphor layers which effectively mask the contributions of these scattering mechanisms to image degradation.

A factor that distinguishes the TEM from other applications using phosphor screens for imaging is the energy range, which is 50 keV and over. The importance of electron energy is evident from consideration of cathode ray tube (CRT) phosphor screens which provide 100 lp/mm resolution in screens that are equivalent to those used in TEM[6]. The penetration range of the lower energy (10 keV) CRT electrons is normally less than the thickness of the CRT phosphor. In contrast, the range of 100 keV TEM electrons is approximately 30 to 60 microns (using the Kanaya-Okayama range[7]) in typical phosphor materials. The lateral scattering distance varies with atomic number of the material but can be a significant fraction of the penetration depth.

[6] I. P. Csorba, *Image Tubes*, Howard W. Sams & Co., Inc., (1985).
[7] J. Goldstein et al., *Scanning Electron Microscopy and X-Ray Microanalysis*, Plenum Press, (1981)

Lateral scattering reduces the contrast of sharp edges by the fraction of the energy deposited outside the radius of the resolution element. Monte Carlo calculations for the response of a typical 20 micron thick scintillator on 2 mm thick glass show that as much as 40% of the light produced by a 100 keV electron is generated outside a 40 micron disk centered at the point of electron incidence.

Reducing the number of electrons scattering back to the phosphor allows fabrication of phosphor screens with greater than 25 lp/mm resolution at electron energy levels below 1 MeV. These screens can be made smaller than existing screens, thus allowing improved optical coupling efficiency through the use of higher magnification.

The present invention provides a method of imaging specimens irradiated with lower energy electrons using phosphor screens with resolution exceeding 25 lp/mm. The resolution of the screens is determined primarily by the characteristics of the TEM and the phosphor/scintillator layer. The phosphor converts the radiation into a visible light image with high resolution and brightness but with negligible influence by the phosphor support material. The image is subsequently received by an electronic camera (such as a vidicon, newvicon, charge storage plate, slow scan CCD, cooled slow scan CCD, or TV rate CCD).

In general, in one aspect, the invention is a method of imaging a specimen by transmission of electrons with energies below 1 MeV. The method includes passing a beam of electrons having energies that are less than 1 MeV through the specimen to produce a first transmitted electron beam; passing the first transmitted electron beam through an imaging screen to generate a light image and a second transmitted electron beam; preventing more than about 95% of the second transmitted electron beam from reflecting back to the imaging screen; and focusing the generated light image onto an electronic camera. The imaging screen includes a support structure and a light generating layer, where the support structure has a thickness that is less than one half the Kanaya-Okayama range of electrons in the imaging screen.

The invention has at least two principal advantages over existing schemes for electron camera imaging. First, the thin supporting layer does not cause significant loss of spatial resolution due to lateral scattering or backscattering of the incident radiation. Thus, the phosphor is excited by only the incoming electrons which have a high degree of spatial resolution. The optical element maintains this resolution by not allowing electrons to restrike the phosphor at point remote from the initial point of incidence. Second, in back-side illumination, the placement of the phosphor on the backside of the support structure eliminates light losses that occur in conventional systems due to reflections at the optical interface between the conventional phosphor and the support structure. In fact, the backside of the support structure can be made reflective so as the increase light output for the device.

Other advantages and features will become apparent from the following description of the preferred embodiments and from the claims.

DESCRIPTION OF THE PREFERRED EMBODIMENTS

In general, the invention has three components. The first component is a support structure that can be either light transparent or opaque but thin enough to be transparent to the majority of incoming electrons. The second component is a phosphor (or scintillator) which is deposited on (or attached to) the thin support structure. The third is an optical element that allows the light generated in the phosphor to reach the electronic camera. The components and their arrangement are designed and/or positioned so as to reduce or eliminate the possibility that scattered electrons will strike the phosphor a second time.

The optical element either reflect or transmit the light produced by the phosphor. This element does not need to focus light and may only transmit or reflect light to a lens. It can be a mirror between the phosphor and the lens that allows electrons to forward scatter away from the phosphor.

Figure 1:
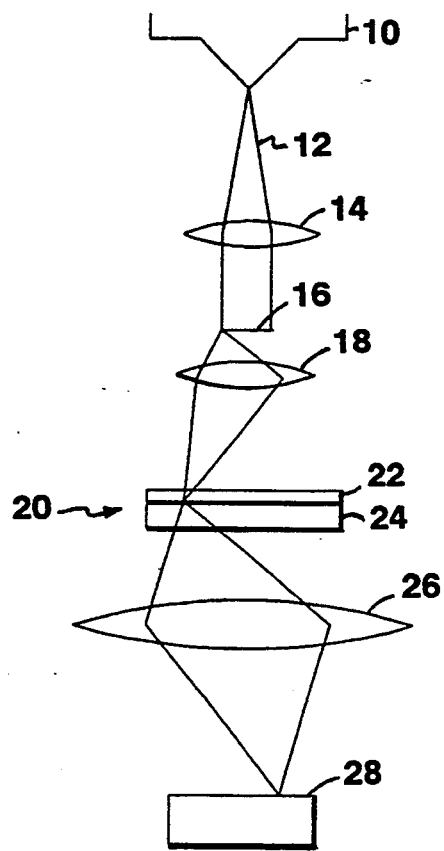
FIG. 1 is a schematic representation of a TEM employing a beam-side illuminated phosphor screen.

The TEM illustrated in FIG. 1 employs a beam-side illuminated phosphor and no mirror. The TEM includes an electron source 10 that generates a beam of electrons 12 having an energy within the range of 50 keV to less than 1 MeV. An electron-optical lens system 14 directs the electron radiation through a specimen 16. Another set of electron-optical lenses 18 located on the opposite side of specimen 16 focuses the electron beam onto a beam-side illuminated imaging screen 20. Imaging screen 20 includes a light generating layer 22 (e.g. phosphor or scintillator) and a thin film support structure 24. Light generating layer 22 is deposited on or attached to the beam-side of thin film support structure 24 so that support structure 24 intercepts some or all of the light which has been emitted by light generating layer 22. A light optical lens or transparent optical element system 26 focuses the light onto an electronic camera 28 that detects the visible light image.

Figure 2:
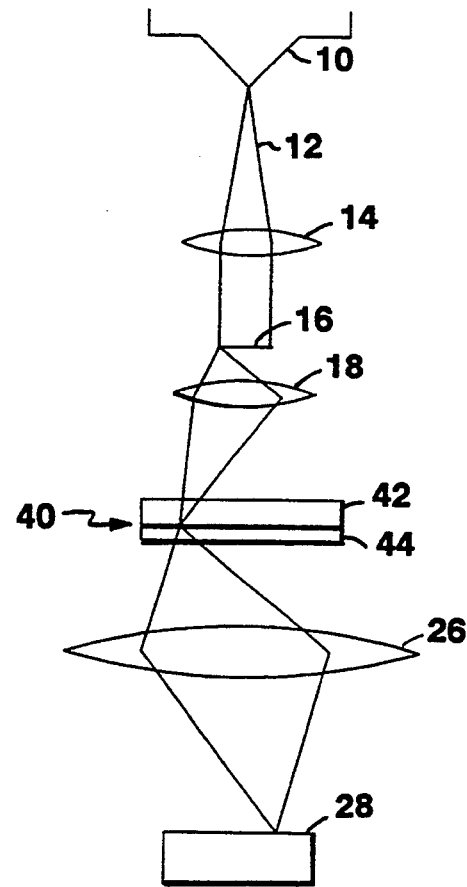
FIG. 2 is a schematic representation of a TEM employing a reflective mirror.

Another embodiment shown in FIG. 2 employs back-side illuminated phosphors. The same numbers have been used for fundamentally identical elements. The principle difference between this embodiment and that of FIG. 1 is that it employs a back-side illuminated imaging screen 40. That is, screen 40 includes a thin film support structure 42 and a light generating layer 44 that is deposited on or attached to the backside of support structure 42. In this case, the light from light generating layer 44 does not pass through support structure on its way to camera 28.

Imaging electrons impinge directly on the phosphor (beam-side illumination) with the light image transmitted through the (transparent) support structure or, alternatively, electrons impinge on the support structure and pass through it and excite the phosphor (back-side illumination). In either case, to be effective, both the light generating layer and the support structure must be thin. The applicable thickness of the light generating layer is about 20 microns or less. The applicable thickness of the support structure is less than half the range of incident electrons in the material of which the support structure is made. Thus, negligible backscattering occurs, and there is very little loss of resolution by lateral scattering of the beam or excitation the phosphor far from the point of incidence.

For the purposes of this invention, the range is defined by the Kanaya-Okayama Range which relates beam energy, material composition and density to the penetration depth of an incident electron by the formula:

$$R_{ko} = 0.0276 \, A \, E^{1.67}/(Z^{0.889} d) \text{ microns}$$

where
A = atomic weight g/mol
E = incident electron energy keV
Z = atomic number
d = material density g/cm$^3$.

Table I below shows examples of maximum film thicknesses in microns (i.e., $\mu$) for various materials.

Note that maximum film thickness is here defined as one-half the K-O Range.

TABLE I

| Material | Electron Beam Energy | | | |
| --- | --- | --- | --- | --- |
|  | 50 keV | 100 keV | 200 keV | 400 keV |
| $C_8$—$H_8$ | 18μ | 58μ | 180μ | 587μ |
| Be | 13μ | 43μ | 140μ | 432μ |
| C | 10μ | 32μ | 100μ | 325μ |
| Al | 9.6μ | 31μ | 98μ | 320μ |

For beam-side illumination, the thin film support structures must be transparent to visible light. For backside illumination, either transparent or opaque films can be utilized. Laminated films with layers that enhance light reflection, light transmission, phosphor adhesion, and mechanical strength and toughness may also be desirable.

Thin structures can be fabricated from most metals, alloys, organic polymers, single crystal and polycrystalline non-metallic films. Finally, layered materials that combine the properties mechanical strength or toughness with optical properties are possible.

It is also possible that the phosphor or scintillator may itself be in the form of a self supporting thin film such as a thin sheet of plastic scintillator or a scintillating crystal.

Also, in the embodiments of both FIG. 1 and FIG. 2, the TEM is configured so as to permit the user to locate optical element system 26 far enough away from the phosphor or scintillator to reduce the probability of electrons restriking the phosphor to less than 5%. The distance is determined by the surface material, its orientation, and the solid angle subtended by the phosphor screen.

Also, it is desirable to prevent the electrons that pass through the imaging screen from bouncing off surrounding structures or optical elements. Scattering from such nearby surfaces can introduce noise and blur the image by striking the phosphor again at points far from the initial point of beam incidence. This degradation effect can be partially avoided by orienting surrounding surfaces such that electrons bounce away from the phosphor. One way to reduce the backscatter of electrons off surrounding structures is to insure that these structures are made of materials having low backscatter efficiency and/or that absorb a large fraction of the penetrating electrons.

Figure 3:
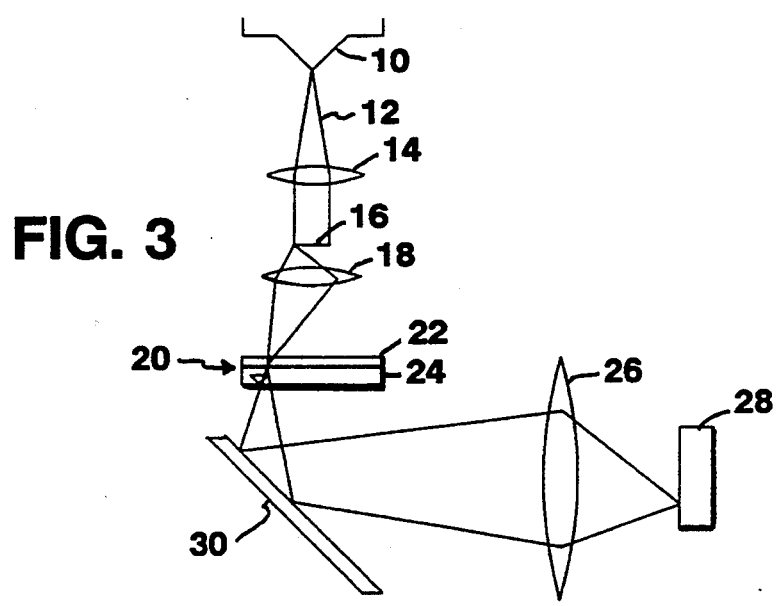
FIG. 3 is a schematic representation of a TEM employing a back-side illuminated phosphor screen.

Another alternative embodiment shown in FIG. 3 uses beam-side illuminated phosphors and a mirror. Since system is fundamentally the same as the system shown in FIG. 1, the reader is again referred to the above description for a discussion of the identically numbered elements. The principle difference is the presence of a mirror 30 that is oriented to reflect the light from imaging screen 20 into optical element system 24 and electronic camera 26, both of which are now aligned in a generally transverse direction relative to electron beam 12.

Mirror 30 reduces or eliminates the probability that electrons will restrike the phosphor and degrade the image. Mirror 30 reflects light into a lens and it causes penetrating electrons to be forward scattered away from the phosphor. To be effective the lens normal should be 15 to 90 degrees off the electron beam axis or far enough away from the phosphor that the probability of an electron bouncing off the mirror and restriking the phosphor is less than 5%. An additional advantage will be achieved if the mirror is fabricated from materials with low yield for electron backscattering and/or x-ray generation. Typically, carbon and beryllium are used for reducing x-ray yield and electron backscatter; although materials with low atomic number (i.e., less than 12) and low density are also often satisfactory.

A poor light reflector such as carbon can be enhanced with a very thin reflective coating. For example, less than 1 micron thick aluminum is needed to reflect light, but the range of 50 to 200 keV electrons in aluminum is much greater than 1 micron. Thus, a layer of high atomic number material (such as aluminum or gold) applied to a low atomic number material (such as carbon) could reflect light but could still have a low electron scattering and low x-ray production. In other words, a way to insure that minimal electron backscattering will occur is to limit the average atomic number of the first 100 microns of the mirror to about 12.

Other embodiments are within the following claims.

What is claimed is:

1. A method of imaging a specimen by transmission of electrons with energies below 1 MeV, said method comprising:

passing a beam of electrons having energies that are less than 1 MeV through said specimen to produce a first transmitted electron beam;

passing the first transmitted electron beam through an imaging screen to generate a light image and a second transmitted electron beam, said imaging screen comprising a support structure and a light generating layer, said support structure having a thickness that is less than one half the Kanaya-Okayama range of electrons in said imaging screen;

preventing more than about 95% of the second transmitted electron beam from reflecting back to said imaging screen; and focusing the generated light image onto an electronic camera.

2. The method of claim 1 wherein the step of passing the first transmitted electron beam through said imaging screen comprises using a phosphor or scintillator material for said light generating layer.

3. The method of claim 2 wherein the step of passing the first transmitted electron beam through said imaging screen comprises using a thickness for said light generating layer of less than about 20 microns.

4. The method of claim 3 wherein the step of preventing comprises sending said second transmitted electron beam and said light image to a mirror having its normal set at an non-collinear angle relative to the second transmitted electron beam, said non-collinear angle selected such that less than 5% of the second transmitted electron beam reflects back to said imaging screen.

5. The method of claim 4 wherein the step of sending said second transmitted electron beam and said light image to said mirror comprises using a reflective coating on said mirror, said mirror including said refelctive coating having an average bulk atomic number less than or equal to 12 in the first 100 microns from the surface of the mirror.

6. The method of claim 3 wherein the step of passing the first transmitted electron beam through an imaging screen comprises first passing said first transmitted beam through said support structure and then passing said first transmitted beam through said light generating layer.

7. The method of claim 3 wherein the step of passing the first transmitted electron beam through an imaging screen comprises first passing said first transmitted beam through said light generating layer and then passing said first transmitted beam through said support structure.

8. The method of claim 3 wherein the step of passing the first transmitted electron beam through an imaging screen comprises using for said support structure a material that is transparent to visible light.

9. The method of claim 3 wherein the step of passing the first transmitted electron beam through said support structure comprises using for said support structure a material that is opaque to visible light.

10. The method of claim 3 wherein the step of passing the first transmitted electron beam through an imaging screen comprises using for said support structure a laminate structure which has a layer to enhance visible light collection efficiency of said support structure.

11. The method of claim 3 wherein the step of passing the first transmitted electron beam through an imaging screen comprises using for said support structure a laminate structure which has a layer to improve mechanical properties of said support structure.

12. A method of imaging a specimen by transmission of electrons with energies below 1 MeV, said method comprising:
passing a beam of electrons from an electron source through said specimen to produce a first transmitted electron beam, the electrons of said beam of electrons having energies that are less than 1 MeV;
passing the first transmitted electron beam through an imaging screen to generate a light image and a second transmitted electron beam, said imaging screen comprising a support structure and a light generating layer formed on a side of said support structure that is proximate to said electron source, said support structure having a thickness that is less than one half the Kanaya-Okayama range of electrons in said support structure, said light generating layer having a thickness less than about 10 microns; and
focusing the generated light image onto an electronic camera.

13. The method of claim 12 wherein the step of passing the first transmitted electron beam through said imaging screen comprises using a phosphor or scintillator material for said light generating layer.

14. The method of claim 13 further comprising the step of preventing comprises sending said second transmitted electron beam and said light image to a mirror having its normal set at an non-collinear angle relative to the second transmitted electron beam, said non-collinear angle selected such that less than 5% of the second transmitted electron beam reflects back to said imaging screen.

15. The method of claim 14 wherein the step of sending said second transmitted electron beam and said light image to said mirror comprises using a reflective coating on said mirror, said mirror including said reflective coating having an average bulk atomic number less than or equal to 12 in the first 100 microns from the surface of the mirror.

16. The method of claim 13 wherein the step of passing the first transmitted electron beam through said imaging screen comprises using for said support structure a material that is opaque to visible light.

17. The method of claim 13 wherein the step of passing the first transmitted electron beam through an imaging screen comprises using for said support structure a laminate structure which has a layer to enhance visible light collection efficiency of said support structure.

18. The method of claim 13 wherein the step of passing the first transmitted electron beam through an imaging screen comprises using for said support structure a laminate structure which has a layer to improve mechanical properties of said support structure.

* * * * *

UNITED STATES PATENT AND TRADEMARK OFFICE
CERTIFICATE OF CORRECTION

PATENT NO. : 5,401,964
DATED : March 28, 1995
INVENTOR(S) : James F. Mancuso, et al It is certified that error appears in the above-indentified patent and that said Letters Patent is hereby corrected as shown below:

Column 1, line 6, insert the following:

This invention was made with Government support under Grant P41 RR04050-06A1 awarded by the National Institutes of Health. The Government has certain rights in this invention.

Signed and Sealed this

Thirteenth Day of August, 1996

Attest:

BRUCE LEHMAN

Attesting Officer     Commissioner of Patents and Trademarks

UNITED STATES PATENT AND TRADEMARK OFFICE
Certificate

Patent No. 5,401,964                                                                Patented: March 28, 1995

On petition requesting issuance of a certificate for correction of inventorship pursuant to 35 U. S. C. 256, it has been found that the above-identified patent, through error and without deceptive intent, improperly sets forth the inventorship.

Accordingly, it is hereby certified that the correct inventorship of this patent is: James F. Mancuso, Rowley, Mass.; Mark J. Ellisman, UC San Diego, Calif.; Gary Fan, UC San Diego, Calif. and Dana G. Dunkelberger, Gilbert, S.C.

Signed and Sealed this Twenty-Third Day of December, 1997.

MICHAEL J. TOKAR, *SPE*
                                                                                                         Art Unit 2506